United States Patent [19]

Bastenbeck et al.

[11] Patent Number: 4,775,557

[45] Date of Patent: Oct. 4, 1988

[54] COMPOSITION AND PROCESS FOR CONDITIONING THE SURFACE OF POLYCARBONATE RESINS PRIOR TO METAL PLATING

[75] Inventors: Edwin W. Bastenbeck, Plymouth; Juan Haydu, Orange; Richard A. Bellemare, Jr., Watertown, all of Conn.

[73] Assignee: Enthone, Incorporated, West Haven, Conn.

[21] Appl. No.: 118,811

[22] Filed: Nov. 9, 1987

[51] Int. Cl.$^4$ ............................................. B05D 3/10
[52] U.S. Cl. ...................................... 427/307; 156/650; 156/668; 427/123; 427/304; 427/305; 427/306; 427/444
[58] Field of Search ............................. 427/304–307, 427/123, 444; 156/656, 668

[56] References Cited

U.S. PATENT DOCUMENTS

| | | | |
|---|---|---|---|
| 3,770,528 | 11/1973 | Hermes | 156/668 |
| 4,090,001 | 5/1978 | Mertzweiller | 427/444 |
| 4,131,698 | 12/1978 | Decket | 427/307 |
| 4,611,892 | 9/1986 | Kawashima et al. | 427/307 |
| 4,664,983 | 5/1987 | Nakamura et al. | 427/307 |

Primary Examiner—Janyce A. Bell
Attorney, Agent, or Firm—John J. Tomaszewski; Kenneth A. Koch

[57] ABSTRACT

A process for specially conditioning and etching a polycarbonate resin prior to metal plating to enhance the coverage and adhesiveness of metal plating to the resin. The swellant composition comprises a compound represented by the general formula, $$R_1(OC_nH_{2n})_m O-R_2$$

wherein $R_1$ and $R_2$ are independently selected from the group consisting of aryl groups and alkyl groups of 1–4 carbon atoms, n is 2 to 4 and m is 1 to 5.

The swelled resin is then etched using, preferably, a highly alkaline composition such as a solution containing greater than about 100 g/l NaOH. Other etchants such as chromic acid may also be used.

The resin is now ready for plating using conventional techniques.

19 Claims, No Drawings

COMPOSITION AND PROCESS FOR CONDITIONING THE SURFACE OF POLYCARBONATE RESINS PRIOR TO METAL PLATING

BACKGROUND OF THE INVENTION

The invention relates to the metal plating of plastics and, in particular, to enhancing the adhesion of metal plating to polycarbonate resins by specially conditioning and etching the resin prior to electroless metal plating of the board.

The metal plating of plastic parts is well-known to be of considerable commercial importance because the desirable characteristics of both the plastic and the metal are combined to offer the technical and aesthetic advantages of each. Thus, a part plated with a bright, metallic finish takes advantage of the economies in cost and weight afforded by substituting molded plastic parts for metal and, additionally, the plated finishes are not as susceptible to pitting and corrosion because there is no galvanic reaction between a plastic substrate and a plated metal.

The problems in plating plastics are well-known in the art and one of the most serious problems is to provide a plating which both substantially covers and is adherent to the plastic. A number of methods have been developed to improve the adhesion of the metal plating to the plastic and these methods generally employ solvents to swell and condition the plastic followed by the use of oxidants to etch the surface of the plastic prior to plating. The oxidants are generally chromic acid, sulfuric acid and mixtures thereof and acidic and alkaline permanganate solutions. These solutions are expensive and, for chromium, toxic, and all present potential safety hazards as well as environmental problems such as water pollution.

The present invention relates to both enhancing the adhesion of metal plating to polycarbonate resins and providing a smooth coating and substantially complete coverage of the resins by the plating by treating the resins before plating with a specially formulated swellant composition and, preferably, using an etchant which is environmentally safe to use and inexpensive. A particularly important process is directed to . plating polycarbonate resins which have been molded into housings for electronic equipment such as personal computers. The metal plating provides a shield against electromagnetic radiation such as radio-frequency interference emitted from electronic and radio equipment. Regulations of the Federal Communication Commission require that certain categories of electronic and computer equipment be enclosed by radio-frequency interference shields. As can be appreciated, the metal plating must substantially cover the housing and be very adherent to the plastic and not delaminate during use. A number of patents addressing the adherance problem have been granted with the patents disclosing the use of many different solvents and etchants to condition the resin before plating.

U.S. Pat. No. 3,758,332 discloses the use of chemicals such as methyl ethyl ketone, tetrahydrofuran, dioxane, pyridine, dimethylformamide, and an alcohol mixture comprising methyl ethyl ketone, ethanol and methanol as swellants and $H_2SO_4$, $H_3PO_4$ and $CrO_3$ as etchants for epoxy resin. U.S. Pat. No. 4,086,128 also shows pretreatment of an epoxy resin with an organic solvent comprising alcohols, acids, esters, ketones nitriles, nitro compounds, and polyhydric compounds such as ethylene glycol, glycerine and 1, 2-propylene glycol prior to etching with hydrogen peroxide and sulfuric acid. U.S. Pat. No. 3,865,623 shows immersion of epoxy resins in an organic solvent such as dimethylformamide to render the epoxy receptive to an acid etch. U.S. Pat. No. 4,592,852 shows a solvent-etch process using a permanganate etchant. The disclosures of the above publications are hereby incorporated by reference.

Unfortunately, however, solvent compositions to swell polycarbonate resins are still needed and materials such as sulfuric acid, chromium compounds and permanganate solutions are still the primary materials used to etch plastics and the need remains for a solvent and etch system which employs materials which are less expensive, safer to use and environmentally acceptable.

SUMMARY OF THE INVENTION

It has now been discovered that both the coverage, e.g., smoothness, and adhesiveness of metal plating and, in particular, electroless metal plating to polycarbonate resins can be enhanced by using a specific organic solvent swellant as part of a typical swell etch procedure or, preferably, by using a novel swell and etch procedure wherein the etchant is an alkaline solution. The resin is first contacted for an effective time at an effective temperature with a swellant composition comprising:

a compound represented by the general formula,

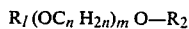

$$R_1(OC_nH_{2n})_m O-R_2$$

wherein $R_1$ and $R_2$ are independently selected from the group consisting of aryl groups and alkyl groups of 1-4 carbon atoms, n is 2 to 4 and m is 1 to 5 in an amount by volume, greater than about 10%.

The swellant composition is, for some applications, optionally alkaline and it is preferred to employ a source of hydroxyl ions such as an alkali metal hydroxide in the composition in an amount up to about 150 g/l or more. The highly preferred swellant composition is a 75% by volume aqueous solution of dimethoxy diethylene glycol. Another preferred composition contains by volume, about 30% to 50% of the glycol and about 30% to 50% of an organic solvent such as ethylene glycol, e.g., 20% water, 40% dimethoxy diethylene glycol and 40% ethylene glycol.

The composition is employed at an effective temperature and, depending on the composition, may range from below room temperature to an elevated temperature, e.g., the lesser of the boiling point of the solution and the softening point of the resin. Room temperature for the most preferred composition of the invention has produced excellent results.

The effective contact time will vary with the composition and temperature of the solution and in general will not exceed about 20 minutes, preferably less than 10 minutes, e.g., 2 to 5 minutes.

The etchant composition is, broadly stated, a highly alkaline solution with the source of alkalinity being preferably an alkali metal hydroxide such as sodium hydroxide. Amounts of the hydroxide component may vary widely up to saturation levels and is preferably about 50-200 g/l. The etchant composition may be used over a range of temperatures up to boiling and is preferably about 50°-80° C.

In general, the process of using the compositions of the invention in preparing metal plated polycarbonate articles is a sequence of steps commencing with cleaning the article followed by contacting the board with the swellant composition of the invention to enhance the effect of the subsequent etching step. The board is then contacted with the etchant. For polycarbonate resins containing glass fibers, a preferred step is to now dissolve some of the glass fibers in the resin using, for example, acid fluorides such as ENPLATE$^R$ ACTANE 70 made by Enthone, Incorporated.

Thereafter the board is ready for plating and may be treated with a promoter composition such as Enplate 3923 and then immersed in a catalyst, such as a tin-palladium solution, which conditions the surface of the resin for electroless metal plating such as copper metal plating. ENPLATE Activator 850 sold by Enthone, Incorporated is exemplary of this type catalyst. Following a water rinse, the laminate is immersed in an accelerator such as ENPLATE 860 to activate the catalyst by freeing the metal palladium ions on the board. After a water rinse, the board is immersed in an electroless copper plating solution for a period of time sufficient to plate copper to the desired thickness on the resin. ENPLATE CU-872 and other similar plating compositions may be employed. The boards may then be electroplated or further electrolessly metal plated using conventional techniques if a thicker or multi-layer coating is desired.

DETAILED DESCRIPTION OF THE INVENTION

The process of the invention has been found to be particularly useful for conditioning polycarbonate resins. The polycarbonate resins are commercially available and may contain fillers such as glass fibers, paper, synthetic fibers, carbon black, alumina powders, silica powders, wax and pigments, mold release agents, reinforcing agents, etc.

If desired, the pH of the swellant composition may be adjusted using any suitable alkaline source and is preferably an alkaline hydroxide such as lithium, sodium, potassium, cesium, and tetraalkyl ammonium. Sodium hydroxide is preferred. The amount of hydroxyl ions can vary widely and is preferably up to about 150 g/l, e.g., 20 to 150 g/l and 40 to 80 g/l.

The compound represented by the formula

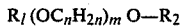

$$R_1(OC_nH_{2n})_m O-R_2$$

is preferably dimethoxy diethylene glycol, wherein $R_1$ and $R_2$ are methyl, m is 2 and n is 2. Dimethoxy tri ethylene glycol (n is 2 and m is 3) provides satisfactory results in an aqueous solution of about 50 to 100% by volume glycol or in an alkaline solution (40 g/l NaOH and 10% by volume glycol) at an elevated temperature of about 50° C. Ethylene glycol dimethyl ether (n is 2 and m is 1) provides satisfactory swellant results when used as a 10% volume solution at room temperature. Dimethoxy tetraethylene glycol (n is 2 and m is 4) provides satisfactory results when used in an aqueous solution of about 50 to 100 volume % at an elevated temperature of about 50° C. The compound is present in the solution in an amount greater than about 10% by volume, most preferably about 30 to 80% by volume.

The preferred etchant composition in general, is an alkaline solution having a pH greater than 10, and most preferably greater than 13 or 14. It is preferred to use an alkali metal hydroxide in an amount up to saturation, and typically about 100–250 g/l.

A preferred etchant composition comprises wetting agents and a buffering agent to moderate the etching effect of the caustic. A material such as sodium carbonate in an amount of about 30–100 g/l provides satisfactory results. The wetting agents used may vary widely and two exemplary materials are ANTAROX BL-240 and GAFAC RA-600, both sold by GAF Corporation. The ANTAROX is an ethoxylated propoxylated mixed octyl/decyl alcohol and the GAFAC is a complex organic phosphate ester free acid. The wetting agents are generally present in small amounts of less than 1%, and usually less than 0.1%, by weight. A preferred etchant is ENPLATE 810 sold by Enthone, Incorporated.

It will be appreciated by those familiar with the art that the components of the etchant composition may vary widely, depending upon, for example, solubility considerations, with the understanding that the important criteria is the combination of the components in an alkaline solution.

Conventional etchants such as chromic acid, sulfuric acid, or combinations thereof, permanganate solutions, etc., may also be used to etch the plastics conditioned using the swellant composition of the invention.

Other additives, such as stabilizers may be used in the swellant and etchant compositions for special purposes as is known in the art.

The composition medias are preferably aqueous and substantially inert with respect to the plastic being treated. Other medias may also be employed, particularly for the swellant composition, such as alcohols and polyhydrics, e.g., glycols (e.g., ethylene glycol, propylene glycol, glycerine, etc.) with a mixture of water and the polyhydric being preferred for some applications. The amount of polyhydric may be the balance of the solution with an amount of 20%–50% being preferred.

To practice the method of the invention the polycarbonate resin article is contacted with the swellant composition at an effective temperature and time sufficient to render the surface receptive to the etching process. Contacting procedures may vary widely and satisfactory results for polycarbonate resins are provided by immersing the part in the solvent for between approximately 2 to 10 minutes at room temperature to 50° C. The time and temperature will vary depending on the particular polycarbonate article being treated and the composition of the solution as will be appreciated by those skilled in the art. Other means such as spraying, may be used for treating the polycarbonate article.

The swelled polycarbonate article is then ready for etching. A highly preferred process employs a hot water rinse after solvent treatment. A water temperature of 65° to 77° C. at 3 to 10 minutes has proven to be effective. It is preferable to precede and also preferable to follow the hot water rinse with a regular room temperature water rinse for 2 to 3 minutes before etching.

Etching may be performed using conventional techniques such as contacting the treated polycarbonate article with the solution at an elevated temperature for a sufficient time, e.g., less than 30 minutes, preferably 5 to 10 or 15 minutes, to promote adhesion to the surface. It is preferred to then rinse the etched polycarbonate part to remove excess solution using a hot water rinse preceded and also followed by a cold water rinse as described hereinabove for the solvent treatment step. If desired, resins containing glass fibers may now be treated with fluoride solutions to remove the fibers from the plastic surface. In general, an etching temperature of about 50° to 90° C. and preferably about 60° to 70° C. provides satisfactory results.

The etched plastic part is now prepared for metal plating by known means such as sensitizing using an aqueous tin chloride solution and then activating by means of palladium chloride. The surface may now be plated with a film of metal by electroless plating. Sensitizing, activating and plating compositions and methods for copper metal electroless deposition are described in U.S. Pat. Nos. 2,874,072; 3,075,855; 3,095,309; and 3,736,156; the disclosures of said patents being hereby incorporated reference. Other methods of deposition may also be used such as vacuum vapor deposition, electrolytic plating or a combination of electroless plating and electrolytic plating.

The present invention will now be described in detail by reference to the following examples.

Metallization of the treated resins were performed using the following procedure:
(a) immerse for 5-10 minutes at 65°-77° C. in Enplate 835;
(b) rinse in room temperature water for 2 minutes;
(c) immerse for 2 minutes at room temperature in Enplate 3923;
(d) rinse in room temperature water for 2 minutes;
(e) immerse for 5 minutes at room temperature in Enplate 850;
(f) rinse in room temperature water for 2 minutes;
(g) immerse for 5 minutes at 66° C. in Enplate 860;
(h) rinse in room temperature water for 2 minutes;
(i) immerse for 15 minutes at 49° C. in Enplate 872;
(j) rinse in room temperature water for 2 minutes;
(k) immerse for 2 minutes at room temperature in Enplate 854;
(l) immerse for 5 minutes at 65.6° C. in Enplate 426;
(m) rinse in room temperature water for 2 minutes.

All the metallized resins were evaluated for adhesion by firmly attaching a strip of adhesive tape to the metallized surface and then removing the tape with a quick snapping motion.

EXAMPLE I

A polycarbonate resin board termed FL-900 and measuring 4 inch×5 inch×¼ inch was treated using the following procedure.
(a) immerse for 10 minutes at room temperature with mild agitation in a 75% by volume aqueous solution of diethylene glycol dimethyl ether (diglyme);
(b) rinse in hot water at 71° C. for 5 minutes;
(c) rinse in room temperature water for 2 minutes;
(d) immerse for 10 minutes at 65.6° C. with mild agitation in a 3N NaOH solution containing 30 g/l BPA (Bisphenol A);
(g) rinse in hot water at 71° C. for 5 minutes;
(h) rinse in room temperature water for 2 minutes;
(i) metallize using the procedure noted hereinabove.

The metal plating substantially covered the resin board with a smooth coating and there was a slight amount of copper adhering to the tape indicating a satisfactory metal coating.

EXAMPLE II

Example I was repeated except that a 3N NaOH, 15% by volume diglyme solution was used as the swellant composition and the metal plating similarly covered the resin board and there was substantially no transfer of the metal deposit to the tape. Likewise, comparative runs using commercial alkaline permanganate and chrome-sulfuric etchant solutions instead of the claimed etchant showed the same metal coverage and adhesive properties.

EXAMPLE III

Example I was repeated using as the etchant Enplate 810 plus 160 g/l NaOH (total NaOH is 205 g/l). Steps a-d of the metallization procedure were not used.

The metal plating substantially covered the resin board and was very adherent to the resin with no significant amount of transfer to the tape. The metallized resin was placed in an autoclave at 15 psig for 30 minutes and tested for adhesion. Similarly excellent adhesion results were obtained.

COMPARATIVE EXAMPLES

Example I was repeated with the following changes in the procedure. Comparative Examples 1 and 2 used a 25% and 50% by volume diglyme swellant solution; Comparative Example 3 used Enplate 810 as the etchant (NaOH concentration - 45 g/l); and Comparative Example 4 used a 75% by volume solution of diethylene glycol monomethyl ether at room temperature for 5 minutes and Comparative Example 5 used a 15% diethylene glycol monomethyl ether, 120 g/l NaOH and 30 g/l BPA solution at 66° C. for 5 minutes.

All comparative examples produced resins having very poor metal adhesion.

It will be apparent that many changes and modifications of the several features described herein may be made without departing from the spirit and scope of the invention. It is therefore apparent that the foregoing description is by way of illustration of the invention rather than limitation of the invention.

What is claimed is:

1. A process for treating a polycarbonate resin prior to etching to enhance the coverage and adhesiveness of metal plating to the etched resin comprising:
   (1) contacting the resin for an effective time and an effective temperature with a swellant composition comprising:
   a compound represented by the general formula, $$R_1(OC_nH_{2n})_m O-R_2$$

wherein $R_1$ and $R_2$ are independently selected from the group consisting of aryl groups and alkyl groups of 1-4 carbon atoms, n is 2 to 4 and m is 1 to 5 in an amount, by volume, greater than about 10%.

2. The process of claim 1 further comprising treating the swelled resin with an etchant comprising an alkaline solution containing greater than about 100 g/l NaOH.

3. The composition of claim 1 wherein the swellant contains an alkali metal hydroxide in an amount of about 20 g/l to 150 g/l.

4. The composition of claim 1 wherein
$R_1$ and $R_2$ are $CH_3$;
n is 2 and m is 2.

5. The swellant composition of claim 2 containing about 20 g/l to 100 g/l alkali metal hydroxide, and the etchant composition contains about 100 g/l to 250 g/l compound alkali metal hydroxide.

6. The composition of claim 5 wherein the alkali metal hydroxide is sodium hydroxide.

7. The method of claim 2 wherein the temperature of the etching step is about 50° C. to 90° C. and the time is less than about 30 minutes.

8. The method of claim 7 wherein the temperature of the etching step is about 50° to 90° C. and the contact time is less than about 10 minutes.

9. The method of claim 8 wherein the resin is an enclosure for electronic equipment.

10. The method of claim 9 wherein the treated enclosure is metallized by activating and electroless plating.

11. The method of claim 10 wherein the article is rinsed with hot water followed by cold water after both the swellant and etchant steps.

12. The process of claim 1 wherein $R_1$ and $R_2$ are methyl groups, n is 2 and m is 2, the contact time is 2 to 10 minutes and the temperature is room temperature to 50° C.

13. The process of claim 12 further comprising treating the swelled resin with an etchant selected from the group consisting of chromic acid, sulfuric acid, or combinations thereof and permanganate solutions.

14. The process of claim 1 further comprising treating the swelled resin with an etchant selected from the group consisting of chromic acid, sulfuric acid, or combinations thereof and permanganate solutions.

15. The process of claim 13 wherein after the swelling step the swelled resin is rinsed with hot water followed by a cold water rinse and then treated with the etchant.

16. The process of claim 14 wherein after the swelling step the swelled resin is rinsed with hot water followed by a cold water rinse and then treated with the etchant.

17. The process of claim 1 further comprising treating the swelled resin with an alkaline etchant composition wherein the alkalinity is provided by a hydroxide component in amounts up to saturation.

18. The process of claim 1 further comprising treating the swelled resin with an alkaline solution having a pH greater than 10.

19. The process of claim 18 wherein the pH is greater than 13.

* * * * *